United States Patent [19]

Lien et al.

[11] Patent Number: 5,079,447
[45] Date of Patent: Jan. 7, 1992

[54] BICMOS GATES WITH IMPROVED DRIVER STAGES

[75] Inventors: Chuen-Der Lien, Mountain View; Chau-Chin Wu, Cupertino, both of Calif.

[73] Assignee: Integrated Device Technology, Santa Clara, Calif.

[21] Appl. No.: 496,469

[22] Filed: Mar. 20, 1990

[51] Int. Cl.[5] .............................................. H03K 17/16
[52] U.S. Cl. ...................................... 307/446; 307/443; 307/570
[58] Field of Search ................ 707/443, 446, 448, 570, 707/546-548, 553-554, 564

[56] References Cited

U.S. PATENT DOCUMENTS

| | | | |
|---|---|---|---|
| 3,735,287 | 5/1973 | Lowe | 331/106 |
| 4,678,943 | 7/1987 | Uragami et al. | 307/446 X |
| 4,746,817 | 5/1988 | Banker et al. | 307/443 X |
| 4,769,561 | 9/1988 | Iwamura et al. | 307/446 |
| 4,791,320 | 12/1988 | Kawata et al. | 307/446 |
| 4,845,385 | 7/1989 | Ruth, Jr. | 307/443 X |
| 4,880,998 | 11/1989 | Ueda | 307/443 X |
| 4,890,018 | 12/1989 | Fukushi et al. | 307/443 X |

OTHER PUBLICATIONS

S. P. Joshi et al., "Poly Emitter Bipolar Hot Carrier Effects in an Advanced BiCMOS Technology" IEDM, pp. 182–185, 1987.

Primary Examiner—David Hudspeth
Attorney, Agent, or Firm—Skjerven, Morrill, MacPherson, Franklin & Friel

[57] ABSTRACT

In accordance with the present invention, an improved output driver stage for a BiCMOS logic gate is provided by including a clamping transistor. Such clamping transistor avoids, in the pull-up bipolar transistor, both degradation of current gain and emitter-to-collector breakdown.

3 Claims, 2 Drawing Sheets

BICMOS GATES WITH IMPROVED DRIVER STAGES

BACKGROUND OF THE INVENTION

This invention relates to the design of BiCMOS logic gates and, in particular, to the design of driver stages for BiCMOS gates free from the problems of "hot carrier" degradation and emitter-to-base breakdown of the pull-up transistor.

DESCRIPTION OF THE PRIOR ART

A BiCMOS circuit contains both bipolar and complementary metal-oxide-silicon (CMOS) transistors in the same circuit. One particular kind of BiCMOS circuit is the BiCMOS logic gate, implementing familiar logic gate functions such as NAND, NOR, AND, INVERT etc.; BiCMOS logic gates are widely used as building blocks for more complex functions in BiCMOS integrated circuits.

BiCMOS circuits enjoy substantially the advantages of both CMOS and bipolar circuits. CMOS circuits are superior in that they are of relatively small size and consume little power as compared to circuits of other technologies. On the other hand, bipolar circuits have the ability to drive high capacitive loads, thereby allowing large circuit fan-outs.

A typical BiCMOS inverter in the prior art is shown in FIG. 1. The BiCMOS inverter is chosen to illustrate, by example, the design of a driver stage in a BiCMOS logic gate. A person skilled in the art of logic circuits will be able to infer from this inverter, labelled 1A, BiCMOS implementations of driver stages for familiar logic functions such as NAND, NOR, AND, OR etc.

As shown in FIG. 1, PMOS transistor 110 and NMOS transistor 120 form a CMOS inverter 100, with the input lead labelled "IN." This input lead IN is also the input lead of the BiCMOS inverter 1A. Transistors 130, 140, 150 and 160 form the driver stage for this BiCMOS inverter 1A.

The output node 115 of this CMOS inverter 100 is connected to an output stage comprising pull-up and pull-down circuits built from both bipolar and MOS transistors. Specifically, the output node 115 of this CMOS inverter 100 is connected to the base lead of pull-up bipolar transistor 130. The collector lead of bipolar transistor 130 is connected to the power supply VCC. The emitter lead of bipolar transistor 130, which is connected to the output node "OUT" of this BiCMOS inverter 1A, is also connected to a pull-down stage comprising NMOS transistors 150 and 160, and bipolar transistor 140.

In transistor 150, the gate terminal is connected to the input lead IN, the drain terminal is connected to the BiCMOS inverter 1A's output lead OUT, and the source terminal is connected both to the base terminal of bipolar transistor 140 and the drain terminal of NMOS transistor 160. The gate terminal of NMOS transistor 160 is connected to the BiCMOS inverter 1A's output lead OUT, which is in turn connected to the collector lead of bipolar transistor 140. The emitter lead of bipolar transistor 140 is connected to common ground.

During logic operation, if the voltage at OUT is originally high, a low-to-high input transition at input lead IN will result in a high-to-low transition at node 115, hence momentarily reverse-biasing the emitter-base junction of transistor 130. At the same time, transistor 150 is turned on, bringing node 155 closer to the voltage at OUT. Since node OUT is originally high, the voltage at node 155 will then turn on transistor 140, thus discharging the node OUT, until the voltage at lead OUT is at approximately 0.4 volts. At this time, transistor 160, having threshold voltage of approximately 0.8 volts, would have turned off. Conversely, if the voltage at OUT is originally at low, a high-to-low transition at input lead IN will result in a low-to-high transition at node 115, thereby turning on transistor 130, bringing node OUT up to logic high. The rising voltage at node OUT turns on transistor 160, thus maintaining the base terminal of transistor 140 substantially at ground level, so that no current is leaked from the output node OUT to common ground through transistor 140. Because bipolar transistors 130 and 140 in this circuit are designed to sink relatively large currents, the advantage of this BiCMOS gate 1A is its switching time being much shorter than the equivalent CMOS implementation driving the same output load.

It is found that reverse-biasing the emitter-base junction degrades the current gain (beta) of a bipolar transistor; this degradation of gain is especially serious under high frequency (e.g. 100 MHz) operations, such as typical in BiCMOS logic circuits. The source of the degradation effect is the injection of hot carriers associated with the high electric field of the strongly reverse-biased junction, which substantially affects the reliability of normal device operation by increase leakage current and reduced gain in forward operation. This effect is studied, for example, in "Poly Emitter Bipolar Hot Carrier Effects in An Advanced BiCMOS Technology", by S. P. Joshi et al, IEDM 87, pp. 182-85.

It is also found that, if the output node OUT of the BiCMOS gate 1A is susceptible to transient noise which causes the emitter voltage to rise above the collector voltage, as for example, due to transient drop in supply voltage VCC, or noise in the output node OUT, the pull-up transistor 130 may break down because of the low emitter-to-collector breakdown voltage typical in high speed bipolar integrated circuits. Shunt diodes have been used to prevent emitter-to-base breakdown (see, for example, RF/DC Generator for Quadruple Mass Analyzer", R. Douglas Lowe, U.S. Pat. No. 3,735,287).

SUMMARY OF THE INVENTION

According to the present invention, an improved output driver stage for a BiCMOS logic gate is provided by including a clamping transistor. The present invention provides improved driver stages in BiCMOS gates capable of driving high capacitive loads without degradation of current gain due to hot carrier effects in the output bipolar transistors.

The present invention also provides improved BiCMOS gates not susceptible to emitter-collector breakdown resulting from fluctuation in the power supply or the output node, which causes the emitter voltage to be higher than the collector voltage.

BiCMOS gates according to the present invention have higher speed performance over corresponding BiCMOS gates in the prior art. This speed performance advantage is especially pronounced under lower VCC power supply condition, when the performance degradation due to the lower supply condition is relatively less in the BiCMOS gates of the present invention, as compared to the prior art BiCMOS gates. In one embodiment, the speed advantage is enhanced by having a pull-down transistor share a common collector body with the clamping transistor.

The present invention will be more fully understood in conjunction with the following detailed description, taking in consideration the accompanying drawings.

DETAILED DESCRIPTION OF THE PREFERRED EMBODIMENTS

Figure 2:
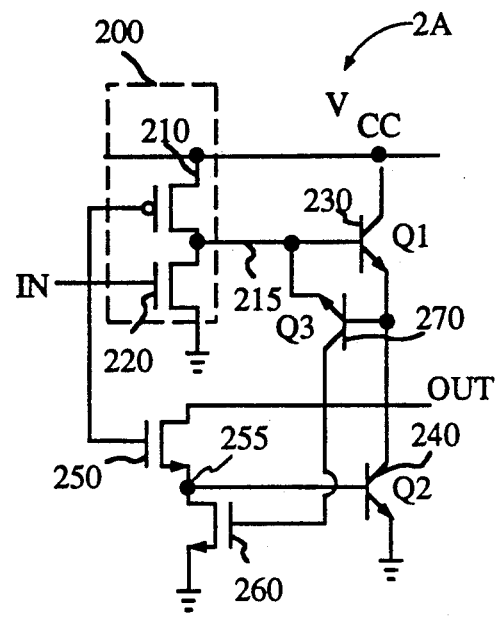
FIG. 2 shows an embodiment of the present invention in a BiCMOS inverter using a BiCMOS pull-down stage.

In accordance with the present invention, a BiCMOS gate having an improved output stage, as illustrated by the example of a BiCMOS inverter 2A, is provided in FIG. 2.

Figure 1:
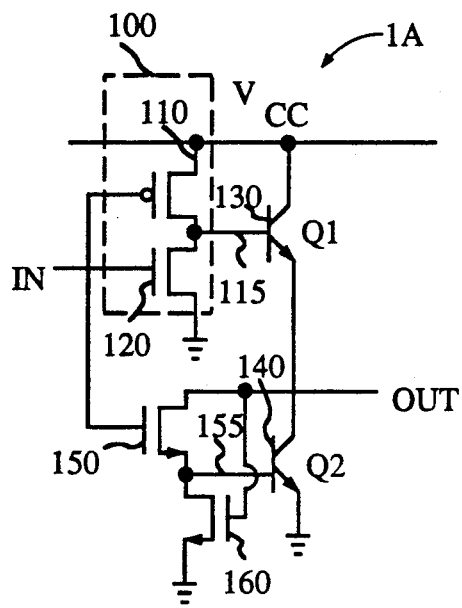
FIG. 1 shows a prior art BiCMOS inverter as an example of the output stage used in BiCMOS gates.

As shown in FIG. 2, PMOS transistor 210 and NMOS transistor 220 form a CMOS inverter 200 as in transistors 110 and 120 of FIG. 1. The input lead of inverter 200 is labelled "IN." This input lead of CMOS inverter 200 is also the input lead of the BiCMOS inverter 2A. Transistors 230, 240, 250, 260 and 270 form the driver stage for this BiCMOS inverter 2A's output, labelled "OUT". The typical size to be used for a 1pF load at node OUT are: PMOS transistor 210 has a width (W) of 25 $\mu$m, and a drawn channel length (L) of 0.9 $\mu$m. The typical size for NMOS transistors 260 and 220 is a width of 5 $\mu$m and a drawn channel length of 0.8 $\mu$m. The typical emitter sizes of bipolar transistors 230, 240, and 270 are 2 $\mu$m, ×3 $\mu$m, 2 $\mu$m×3 $\mu$m, and 1 $\mu$m×3 $\mu$m respectively. Of course, transistor sizes suggested for this and other embodiments are provided for example only. The use of larger or smaller sizes are determined by the available manufacturing and process technologies, among other factors, such as yield. The present invention, as practiced by one skilled in the art, is not limited by the choices of transistors given herein. The skilled person will be able to make reasonable choice of transistor sizes.

As in node 115 of FIG. 1, the output node 215 of this CMOS inverter 200 in FIG. 2 is connected to a driver stage comprising pull-up and pull-down circuits built from both bipolar and MOS transistors. Specifically, the output node 215 of this CMOS inverter 200 is connected to the base lead of pull-up bipolar transistor 230. The collector lead of bipolar transistor 230 is connected to the power supply VCC. The emitter lead of bipolar transistor 230, which is also the output node "OUT" of this BiCMOS inverter 2A, is connected to a pull-down stage comprising NMOS transistors 250 and 260, and bipolar transistor 240.

The gate terminal of transistor 250 is connected to the input lead IN, the drain terminal of transistor 250 is connected to the BiCMOS inverter 2A's output lead OUT, and the source terminal of transistor 250 is connected both to the base lead of bipolar transistor 240 and the drain terminal of NMOS transistor 260. The gate terminal of NMOS transistor 260 is connected to the BiCMOS inverter 2A's output lead OUT, which is in turn connected to the collector lead of bipolar transistor 240. The emitter lead of bipolar transistor 240 is connected to common ground.

Unlike FIG. 1, however, an extra bipolar transistor 270 is introduced. The base and collector leads of bipolar transistor 270 are connected to the BiCMOS inverter 2A's output lead OUT, and the emitter lead of bipolar transistor 270 is connected to the base lead of pull-up bipolar transistor 230.

During logic operation, if the voltage at OUT is originally high, a low-to-high input transition at input lead IN will result in a high-to-low transition at node 215. However, unlike the BiCMOS inverter 1A of FIG. 1, strong reverse-biasing of the emitter-base junction in transistor 230 is avoided because transistor 270, which is turned on by the voltage drop across the nodes OUT and 215, clamps the voltage drop across the emitter-base junction of transistor 230 to approximately 0.7 volts which is the voltage drop of forward-biased base-emitter junction of transistor 270. Because pull-up transistor 230 is not strongly reverse-biased, current gain degradation of transistor 230 due to hot carriers injected into the reverse-biased junction is hence eliminated.

At the time of the input low-to-high transition, transistor 250 is turned on, bringing node 255 closer to the voltage at OUT. Because the output node OUT is originally at logic high, the transistor 240 is forward-biased, thus discharging the node OUT until the voltage at OUT is sufficiently low to turn off transistor 260.

On the other hand, if the voltage at OUT is originally at low, a high-to-low transition at input lead IN will result in a low-to-high transition at node 215, thereby turning on transistor 230 and bringing node OUT up to logic high. Note that transistor 270 is not turned on during this transition. As in the corresponding transistors 140 and 150 of the BiCMOS inverter 1A in FIG. 1, transistors 240 and 250 are turned off. The rising voltage at the BiCMOS inverter 2A's output lead OUT turns on transistor 260 to ensure the node 255 is maintained at common ground, so that no current leaks from the output node OUT to common ground through transistor 240.

Another benefit of the present invention is the avoidance of emitter-collector breakdown in the pull-up transistor 230 resulting from, for example, noise at the output node OUT, or fluctuation in the VCC supply voltage. The failure condition occurs when node OUT is at a higher electrical potential than the VCC supply voltage. In high speed bipolar integrated the circuits, it is not uncommon that the emitter-to-collector breakdown voltage is low enough that breakdown occur because of transient voltage drop across the emitter and collector leads of the transistor. According to the present invention, the base-emitter junction of transistor 270 is forward-biased when node OUT is at a higher potential than VCC, thereby clamping node 215 to 0.7 volts below the voltage at node OUT. Normally, because PMOS transistor 210 is on, the voltage drop across the node OUT and VCC is equal to the forward-biased base-emitter junction of transistor 270. Hence, even in the worst case, when PMOS transistor 212 does not pull node 215 to VCC level, the base-collector junction of transistor 230 is forward-biased, the emitter-collector voltage drop is no more than twice the voltage drop of a forward-biased emitter-base junction, or approximately 1.4 volts, insufficient to cause emitter-to-collector breakdown at transistor 230.

The present invention is particularly space efficient because transistors 240 and 270 can share a common collector. Since the collector region in the layout of a bipolar transistor typically occupies the most space, the ability to share a common collector region between transistors 240 and 270 suggests that the space cost of introducing transistor 270 into the output stage of BiCMOS logic gate 2A is minimal.

The present invention also decreases the switching time of the BiCMOS logic gate, since it provides an extra pull-down path formed by the forward-biased bipolar transistor 270 and MOS transistor 220.

The introduction of a clamping transistor 270 in accordance with the present invention is also superior to having a diode across the base-emitter function of the pull-up transistor 230, because of the current amplification $\beta$ available in a bipolar transistor and not present in a diode. Because of circuit amplification, the voltage clamping effect of the bipolar transistor 270 sets in sooner than a diode of comparable size by a factor of theoretically, $\beta+1$.

Another advantage of the present invention is the performance at lower power supply voltage. In order for transistor 240 to turn on, the base-emitter voltage drop in transistor 240 must be about 0.7 volts. Therefore, to turn on transistor 240, the voltage at the gate terminal of transistor 250 must be its threshold voltage (approximately 0.8 volts) plus the base-emitter voltage of transistor 240. In practice, a back-gate bias voltage adds an extra 0.2 volts to the voltage necessary at the gate terminal of transistor 220 for transistor 240 to turn on. That is, in the absence of transistor 270, the effective voltage at the gate terminal of transistor 250 must be at least 1.7 volts. It is known that the switching time of the BiCMOS gate degrades as the VCC supply voltage is reduced due to the high voltage necessary to turn on the pull-down stage (primarily the output pull-down transistor, such as 240). This effect is ameliorated, however, in accordance with the present invention, by transistor 270. This is because the extra pull-down path formed by MOS transistor 220 and the clamping transistor 270 is turned on when the voltage at the gate terminal of transistor 220 reaches its threshold voltage, i.e. 0.8 volts., instead of 1.7 volts otherwise needed.

Figure 3:
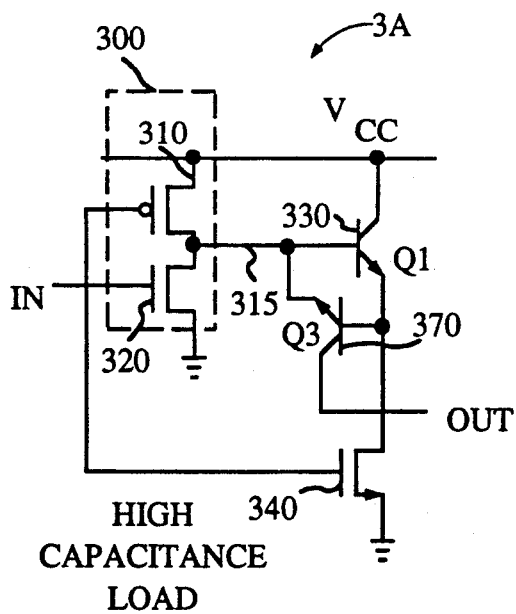
FIG. 3 shows an embodiment of the present invention in a BiCMOS inverter using an NMOS pull-down stage 340.

FIG. 3 shows another embodiment of the present invention. Where the load driven by the output of the BiCMOS logic gate is comparable or smaller than the load in the driver stage (e.g. total capacitance in transistors 240, 250 and 260), the driver stage design in the BiCMOS gate 3A of FIG. 3 may be preferable to the BiCMOS gate shown in FIG. 2. In FIG. 3, as compared the FIG. 2, the pull-down stage of the BiCMOS logic gate 3A is replaced by one NMOS transistor 340. In this embodiment, the BiCMOS logic gate will occupy less space, but will have a slower switching time because of the decreased current drive resulting from the replacement of the bipolar transistor 240 by an MOS pull-down transistor 340. Accordingly, the sizes of other transistors in the circuit may be reduced also in order to achieve a matched performance. Hence, the typical sizes for transistors in this embodiment, assuming a 1pF load, are as follows: emitter sizes of bipolar transistors 330 and 370 are each 1 $\mu$m $\times$ 3 $\mu$m, NMOS transistor 340 is 70 $\mu$m (W) and 0.8 $\mu$m (L), PMOS transistor 310 is 13 $\mu$m (W) and 0.9 $\mu$m (L), and NMOS transistor 320 is 3 $\mu$m (W) and 0.8 $\mu$m (L). However, because a bipolar transistor turns off when the voltage drop across its base-emitter junction falls below approximately 0.7 volts, the BiCMOS logic gate 3A shown in FIG. 3 has the advantage over the BiCMOS gate 2A shown in FIG. 2 because the node OUT may be driven much closer to ground. This is because the input node IN at high logic state (much above transistor 340's threshold voltage of approximately 0.8 volts) will ensure transistor 340 to be in the "on" state until voltage at node OUT is substantially equal to ground.

Figure 4:
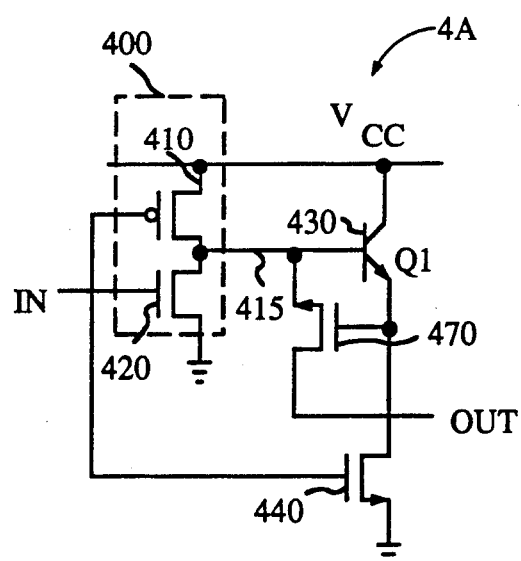
FIG. 4 shows an embodiment of the present invention in a BiCMOS inverter using an NMOS clamping transistor 470.

For even smaller output load, the embodiment of the present invention shown in FIG. 4 may be used. In FIG. 4, as compared to FIG. 3, the clamping transistor 370 is replaced by an NMOS transistor 470. The replacement of bipolar transistor 370 by NMOS transistor 470 is appropriate because bipolar transistor 370 adds to the total capacitance of the node OUT because of its collector-to-substrate capacitance. Furthermore, even though an NMOS transistor cannot provide the current driving ability of a bipolar transistor (therefore slower), it is more efficient in terms of power consumption. In this embodiment of the present invention in FIG. 4, when input lead IN makes a low-to-high transition, the voltage drop across the emitter-base junction in transistor 430 is clamped to, instead of one diode drop which is about 0.7 volts, the threshold voltage of the transistor 470, which is typically 0.8 volts.

Assuming a 0.5 pF load, NMOS transistor 420 is 5 $\mu$m (W) and 0.8 $\mu$m (L), PMOS transistors 410 is 15 $\mu$m (W) and 0.8 $\mu$m (L), emitter size of bipolar transistor 430 is 1 $\mu$m $\times$ 3 $\mu$m, NMOS transistor 440 is 35 $\mu$m (W) $\times$ 0.8 $\mu$m (L) and NMOS transistor 470 is 5 $\mu$m (W) and 0.8 $\mu$m (L).

Figure 5:
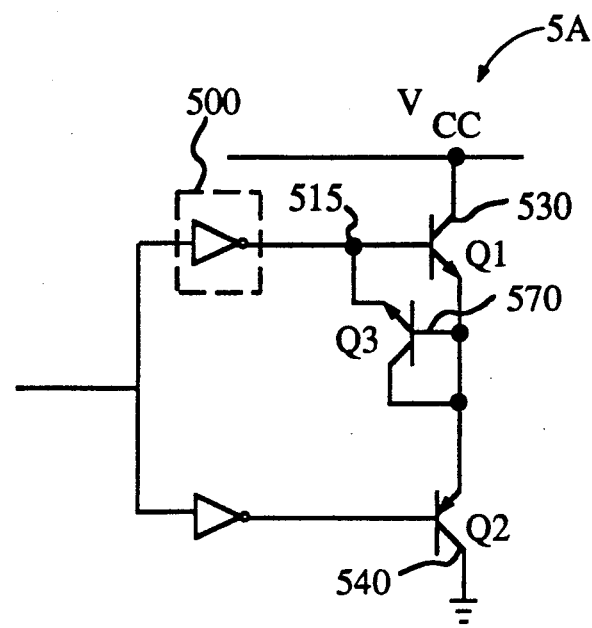
FIG. 5 shows an embodiment of the present invention using a PNP transistor 540 in the pull-down stage.

FIG. 5 shows another embodiment of the present invention. In this embodiment, the pull-down stage of BiCMOS logic gate 5A is implemented by a PNP transistor 500', driven at the base by the inverted input signal on input lead IN.

In this embodiment, assuming also an output load of 1pF, because the CMOS inverter 500' must provide the turn on drive current for PNP transistor 540, the NMOS transistor inside CMOS inverter 500' must be made relatively large. Therefore, the PMOS transistor inside CMOS inverter 500' is 10 $\mu$m (W) and 0.8 $\mu$m (L), and the NMOS transistor inside CMOS inverter 500' is 15 $\mu$m (W) and 0.8 $\mu$m (L). The PNP transistor 540 has emitter size 2 $\mu$m $\times$ 5 $\mu$m. The size of transistors in CMOS inverter 500 are the same as those of CMOS inverter 200 in FIG. 2. The sizes of NPN bipolar transistors 530 and 570 are also the same as those of 230 and 270 respectively.

Figure 6:
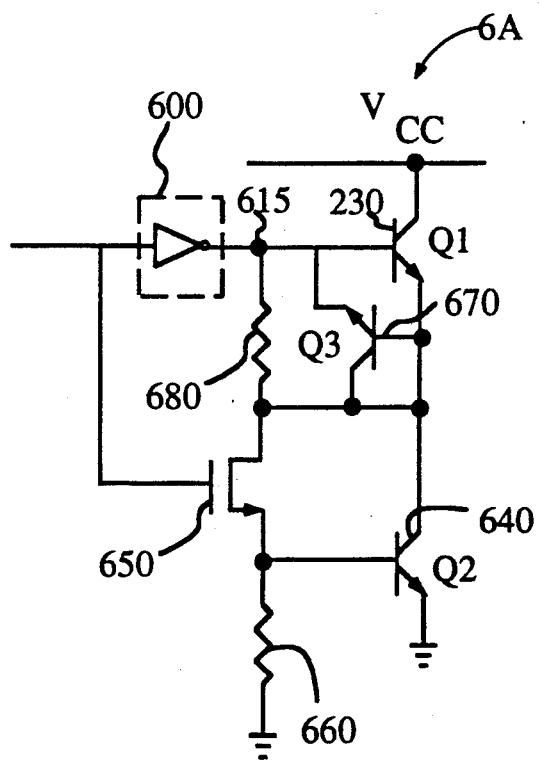
FIG. 6 shows an embodiment of the present invention using resistors 680 and 690.

FIG. 6 shows another embodiment of the present invention, where the pull-down stage of BiCMOS logic gate 6A is implemented by bipolar transistors 640, NMOS transistor 650, and two resistors 680 and 660. The use of resistors 680 and 660 allows the voltage at lead OUT to attain the full voltage swing of the power supplies. However, resistors 680 must be chosen with both the pull-up ability of inverter 600 and the external load in mind. If the resistance value of resistor 680 is too low, the switching speed of the BiCMOS logic gate 6A will be reduced because of the loading introduced by resistor 680. Therefore, resistor 680 must be chosen such that it leaks no more than 5–10% of the current drive ability of the PMOS transistor inside CMOS inverter 600 when a voltage drops equal to the supply voltage VCC is across the terminals of resistor 680. Likewise, resistor 660 must also be chosen to avoid loading of the pull-down circuit. Again, resistor 660 must not leak a current larger than 5-10% of the current drive ability of NMOS transistor 650, when a voltage drop equal to the supply voltage VCC is found across the terminals of resistor 660.

The above detailed description is meant to be exemplary and not limiting. The person skilled in the art will be able to, in consideration of the above detailed description in conjunction with the accompanying diagrams, suggest many variations and modifications within the scope of the invention. Such variations and modifications include but not limited to incorporating the present invention into other BiCMOS gates of other logic functions not described herein.

We claim:

1. A BiCMOS logic gate, connectable to positive and ground power supplies, comprising:
   a CMOS logic gate for providing a logic signal;
   a gate output lead for providing as the output signal of said BiCMOS logic gate a signal having the same logic level as said logic signal;
   a pull-up bipolar transistor of the NPN type having collector, base and emitter leads, said collector lead of said pull-up bipolar transistor connectable to said positive power supply, said base lead of said pull-up bipolar transistor connected to receive said logic signal, and said emitter lead of said bipolar transistor connected to said gate output lead;
   pull-down means having first and second leads, said first lead of said pull-down means connected to said gate output lead, and said second lead of said pull-down means connectable to said second power supply; and
   clamping means having first and second clamping leads, said first clamping lead connected to said emitter lead of said pull-up bipolar transistor, said second clamping lead connected to said base lead of said pull-up bipolar transistor, such that the voltage drop across said first and second clamping leads has a magnitude less than a predetermined value; wherein said clamping means comprises a NMOS transistor having gate, source and drain leads, said first clamping lead being said drain lead of said NMOS transistor, said second clamping lead being said source lead of said NMOS transistor, and said gate lead of said NMOS transistor connected to said gate output lead.

2. A BiCMOS logic gate, connectable to positive and ground power supplies, comprising:
   a CMOS logic gate for providing a logic signal;
   a gate output lead for providing as the output signal of said BiCMOS logic gate a signal having the same logic level as said logic signal;
   a pull-up bipolar transistor of the NPN type having collector, base and emitter leads, said collector lead of said pull-up bipolar transistor connectable to said positive power supply, said base lead of said pull-up bipolar transistor connected to receive said logic signal, and said emitter lead of said bipolar transistor connected to said gate output lead;
   pull-down means having first and second leads, said first lead of said pull-down means connected to said gate output lead, and said second lead of said pull-down means connectable to said second power supply; and
   clamping means having first and second clamping leads, said first clamping lead connected to said emitter lead of said pull-up bipolar transistor, said second clamping lead connected to said base lead of said pull-up bipolar transistor, such that the voltage drop across said first and second clamping leads has a magnitude less than a predetermined value;
   wherein said pull-down means comprises:
   an inverter having an output lead and an input lead, said input lead providing a signal of a logic level opposite to the logic level of said logic signal; and
   a PNP transistor having collector, base and emitter leads, wherein said base lead of said PNP transistor is connected to said output lead of said inverter, said collector lead of said PNP transistor being said first lead of said pull-down means and said emitter lead of said PNP transistor being said second lead of said pull-down means.

3. A BiCMOS logic gate, connectable to positive and ground power supplies, comprising:
   a CMOS logic gate for providing a logic signal;
   a gate output lead for providing as the output signal of said BiCMOS logic gate a signal having the same logic level as said logic signal;
   a pull-up bipolar transistor of the NPN type having collector, base and emitter leads, said collector lead of said pull-up bipolar transistor connectable to said positive power supply, said base lead of said pull-up bipolar transistor connected to receive said logic signal, and said emitter lead of said bipolar transistor connected to said gate output lead;
   pull-down means having first and second leads, said first lead of said pull-down means connected to said gate output lead, and said second lead of said pull-down means connectable to said second power supply; and
   clamping means having first and second clamping leads, said first clamping lead connected to said emitter lead of said pull-up bipolar transistor, said second clamping lead connected to said base lead of said pull-up bipolar transistor, such that the voltage drop across said first and second clamping leads has a magnitude less than a predetermined value;
   wherein said pull-down means comprises:
   a first resistor having first and second leads, said first lead of said first resistor connected to receive said logic signal, and said second lead of said first resistor connected to said gate output lead;
   an NMOS transistor having source, gate, and drain leads, said source lead of said NMOS transistor connected to said gate output lead, and said gate lead of said NMOS transistor provided a signal of a logic level opposite to the logic level of said logic signal; and,
   a second resistor having first and second leads, said first lead of said second resistor connected to said source lead of said NMOS transistor, and said second lead of said NMOS transistor being said second lead of said pull-down means.

* * * * *